(12) United States Patent
Kitamura et al.

(10) Patent No.: US 6,373,806 B1
(45) Date of Patent: Apr. 16, 2002

(54) TWO-COLOR HOLOGRAM RECORDING/REPRODUCING APPARATUS

(75) Inventors: Kenji Kitamura; Yasunori Furukawa; Shunji Takekawa; Myeongkyu Lee, all of Tsukuba; Satoru Tanaka, Tsurugashima; Takashi Yamaji, Tsurugashima; Hideki Hatano, Tsurugashima, all of (JP)

(73) Assignees: Director General of National Institute for Research in Inorganic Materials, Science and Technology Agent, Japan; Pioneer Corporation, both of Tokyo (JP)

( * ) Notice: Subject to any disclaimer, the term of this patent is extended or adjusted under 35 U.S.C. 154(b) by 0 days.

(21) Appl. No.: 09/630,763

(22) Filed: Aug. 2, 2000

(30) Foreign Application Priority Data

Aug. 31, 1999 (JP) .......................... 11-244297

(51) Int. Cl.[7] ................................ G11B 7/00
(52) U.S. Cl. .................. 369/103; 369/121; 369/288
(58) Field of Search ................... 369/103, 108, 369/117, 121, 112.21, 275.1, 288; 359/3, 7–22

(56) References Cited

U.S. PATENT DOCUMENTS 5,416,616 A * 5/1995 Jenkins et al. .............. 369/103
5,978,108 A * 11/1999 Bai et al. .................... 359/3

* cited by examiner

Primary Examiner—Paul W. Huber
(74) Attorney, Agent, or Firm—Finnegan, Henderson, Farabow, Garrett & Dunner, L.L.P.

(57) ABSTRACT

A two-color hologram recording/reproducing apparatus is capable of directing interferable signal light and reference light into a hologram recording medium to record an information signal carried by the signal light. The hologram recording medium is sensitive to a first light at a first wavelength in an ultraviolet or short-wavelength visible light band to develop light induced absorption. The apparatus includes a light source for irradiating the hologram recording medium with the first light, a laser light source for irradiating the hologram recording medium with signal light and reference light at a second wavelength longer than the first wavelength after the first light is irradiated, and a gate light source for directing gate light at a third wavelength into the hologram recording medium. The gate light causes the hologram recording medium to develop a recording sensitivity to activate or inactivate a refractive index grating in accordance with existence or non-existence of a light interference pattern formed by the signal light and the reference light.

8 Claims, 7 Drawing Sheets

TWO-COLOR HOLOGRAM RECORDING/REPRODUCING APPARATUS

BACKGROUND OF THE INVENTION

1. Field of the Invention

The present invention relates generally to an optical information recording/reproducing apparatus utilizing a holographic memory, and more particularly to a two-color hologram recording/reproducing apparatus and a method therefor and a method therefor for recording a signal which are free from deterioration when it is reproduced later.

2. Description of the Related Art

Conventionally, a holographic memory system is known as a digital recording system which applies the principle of holography. In the following, a holographic memory system will be generally described with reference to FIG. 1.

In FIG. 1, an encoder 25 converts digital data to be recorded in a holographic memory 1 to a light/dark dot pattern image on a plane, and rearranges the dot pattern image into a data array of, for example, 480 bits in the vertical direction and 640 bits in the horizontal direction (480×640) to generate sequence data in unit pages. This data is sent to a spatial light modulator (SLM) 15, such as a transmission-type TFT liquid crystal display (LCD) panel, by way of example.

The spatial light modulator 15, which has a modulation processing unit corresponding to the unit page composed of 480 bits in the vertical direction and 640 bits in the horizontal direction (480×640), optically modulates a light beam irradiated thereto to spatial light on/off signal in accordance with the unit page sequence data from the encoder 25, and sends the modulated signal beam or signal light to a lens 16. More specifically, the spatial light modulator 15 passes therethrough a signal beam corresponding to a logical value "1" in the unit page sequence data which is an electrical signal, and blocks the signal beam corresponding to a logical value "0" in the unit page sequence data to achieve photo-electric conversion in accordance with respective bit contents of the unit page data, thereby generating a signal beam which is modulated as signal light of the unit page sequence.

The signal light is incident on the holographic memory 1 through a lens 16. In addition to the signal light, the holographic memory 1 is also irradiated with reference light at an incident angle β from a predetermined base line orthogonal to the optical axis of the beam of the signal light.

The signal light and the reference light interfere with each other in the holographic memory 1 to produce interference fringes which are stored in the holographic memory 1 as a refractive index grating or hologram to record the data. Also, the holographic memory 1 provides for three-dimensional data recording by entering the reference light thereto with a different incident angle β to record a plurality of two-dimensional planar data in an angle multiplex scheme.

For reproducing recorded data from the holographic memory 1, the reference light only is directed into the holographic memory 1 at the same incident angle β as recording, toward the center of a region in which the signal light beam and the reference light beam intersect. In other words, unlike recording, the signal light is not directed. In this way, diffraction light from the interference fringes recorded in the holographic memory 1 is led to a CCD (Charge Coupled Device) 20, which functions as a photodetector, through a lens 19. The CCD 20 converts light and dark of the incident light to the intensity of an electrical signal to produce an analog electrical signal having a level in accordance with the luminance of the incident light, which is output to a decoder 26. The decoder 26 compares this analog signal with a predetermined amplitude value (slice level) to reproduce corresponding data "1" and "0."

Since the holographic memory records data in two-dimensional planar data sequences as described above, the angle multiplex recording can be accomplished by changing the incident angle β of the reference light. Stated another way, a plurality of two-dimensional planes as recording units can be defined in the holographic memory by changing the incident angle β of the reference light, with the result that three-dimensional recording is enabled.

Conventionally, for a rewritable holographic memory 1 utilizing the photo-refractive effect, Fe-added lithium niobate ($LiNbO_3$, or abbreviated as "LN") single crystals are used as recording materials, while a wavelength of 532 nm, which is a second harmonic of an Nd:YAG laser, is used as recording light. In this conventional recording scheme (called the "conventional single-color recording scheme"), corresponding to interference fringes formed from signal light and reference light, which are recording light, electrons are excited from an $Fe^{2+}$ state to a conduction band in light regions of the interference fringes, undergo a photo-refractive process, and are finally trapped to an $Fe^{3+}$ state to complete the storage.

However, the conventional single-color recording scheme implies a problem that reproduction light gradually erases the recorded hologram when a signal is read from the hologram (which is so called reproduction deterioration). The medium has a sensitivity to light of one wavelength that is used at the time of recording and reproduction. In the single color hologram, recorded information is electrons trapped at the trap level (storage center) which is produced by Fe. That is, every time reproduction is performed, electrons are gradually excited to the conduction band from the trap level, thereby erasing the stored information. According to the conventional holographic memory, when signals are read from a hologram recorded there, reproduction light gradually erases the hologram, so that the reproduction deterioration occurs.

On the other hand, a two-color hologram scheme is known as a recording scheme which suffers from less reproduction deterioration.

The two-color hologram recording is characterized in that a hologram is recorded by simultaneously irradiating other light called "gate light" (at wavelength $\lambda 2$), in addition to recording light (reference light and signal light at wavelength $\lambda 1$) for forming the hologram. The gate light acts to develop a recording sensitivity at the wavelength ($\lambda 1$) of the recording light only during the irradiation of the gate light. Such a characteristic is based on carriers temporarily formed by the irradiated gate light at a relatively shallow energy state called an "intermediate excitation state" within a portion of the crystal irradiated with the gate light. The carriers at the intermediate excitation state are excited by the recording light (a spatial light/dark pattern corresponding to interference fringes formed by the reference light and the signal light), and finally accumulated in the form of a variable density distribution of the carriers corresponding to the interference fringes at a deep trap state. The latter process of the two-color hologram scheme, which is called the "photo-refractive effect," is in principle the same process as the single-color hologram. For example, with the two-color hologram recording scheme using crystals which are processed to be reduced to $LiNbO_3$ with no additive component or with Fe added thereto, and have a composition close to the stoichiometry (abbreviated as "SLN") (H. Guenther, R. M. Macfarlane, Y. Furukawa, K. Kitamura, R. Neurgaonkar; "Two-color holography in reduced near-stoichiometric lithium niobate", Appl. Opt. Vol. 37, pp. 7611–7623 (1998)), the lifetime of carriers at the intermediate excitation state (metastable state) can be extended from microseconds to seconds, thereby making it possible to use a continuous oscillating laser having relatively small power for recording.

While the two-color hologram recording scheme requires a reduction of a recording material to increase the PR center density (bipolaron-polaron mechanism), this results in a lower density of $Fe^{3+}$ (trivalent) to degrade the transparency of the material itself. Also, since the light sensitivity is still insufficient for a practical level, there has been a need for development of a hologram recording scheme which provides a higher sensitivity.

Further, in the two-color holographic recording scheme, if the lifetime of the intermediate excitation state is so long that carriers exist at that state even after writing, carriers excited upon reading reflect the electric field to recombine. As a result, since such carriers cancel the previously formed spatial electric field, the diffraction efficiency is significantly reduced. Moreover, the sensitivity to the irradiated gate light is low, so that an effective working wavelength must be selected from limited options.

OBJECT AND SUMMARY OF THE INVENTION

It is therefore an object of the present invention to provide a two-color hologram recording/reproducing apparatus which is capable of increasing the light sensitivity to extend a range of selection for the wavelength of irradiated gate light, and for reducing the signal deterioration during reproduction to exhibit good data indestructibility.

The present invention provides a two-color hologram recording/reproducing apparatus for directing interferable signal light and reference light into a hologram recording medium to record an information signal carried by the signal light, wherein hologram recording medium is sensitive to a first light at a first wavelength in an ultraviolet or short-wavelength visible light band to develop light induced absorption. The apparatus includes means for irradiating the hologram recording medium with the first light; means for irradiating the hologram recording medium with signal light and reference light at a second wavelength longer than the first wavelength after the first light is irradiated; and gate light means for directing gate light at a third wavelength into the hologram recording medium, wherein the gate light causes the hologram recording medium to develop a recording sensitivity to activate or inactivate a refractive index grating in accordance with existence or non-existence of a light interference pattern formed by the signal light and the reference light.

In an aspect of the present invention, said hologram recording medium comprises a photo-refractive material selected from a group consisting of a lithium niobate ($LiNbO_3$) single crystal which includes a rare earth element, and has a molar fraction of $[Li_2O]/([Li_2O]+[Nb_2O_5])$ in a range of 0.482 to 0.505, or a lithium tantalate ($LiTaO_3$) single crystal which includes a rare earth element, and has a molar fraction of $[Li_2O]/([Li_2O]+[Ta_2O_5])$ in a range of 0.482 to 0.505.

In another aspect of the present invention, the molar fraction of $[Li_2O]/([Li_2O]+[Nb_2O_5])$ of lithium niobate lies in a range of 0.490 to 0.505 or the molar fraction of $[Li_2O]/([Li_2O]+[Ta_2O_5])$ of lithium tantalate lies in a range of 0.490 to 0.505.

In another aspect of the present invention, said rare earth element is Tb, and is doped by an amount ranging from 10 weight ppm to 1,000 weight ppm.

In a further aspect of the present invention, said photo-refractive material simultaneously includes Fe or Mn in addition to Tb.

In a still further aspect of the present invention, said photo-refractive material includes Fe or Mn by an amount ranging from 1 weight ppm to 500 weight ppm.

In an aspect of the present invention, said means for irradiating said hologram recording medium with signal light and reference light includes reference light means for directing a reference light beam into said hologram recording medium, and signal light means for directing a signal light beam modulated in accordance with image data into said hologram recording medium such that said signal light beam intersects with said reference light beam within said hologram recording medium to produce a three-dimensional light interference pattern with said reference light.

In another aspect of the present invention, the two-color hologram recording/reproducing apparatus further comprises means for detecting diffraction light from the refractive index grating of the light interference pattern of said hologram recording medium produced by said reference light beam irradiated thereto.

DETAILED DESCRIPTION OF THE PREFERRED EMBODIMENTS

An embodiment of the present invention will hereinafter be described with reference to the accompanying drawings.

Figure 1:
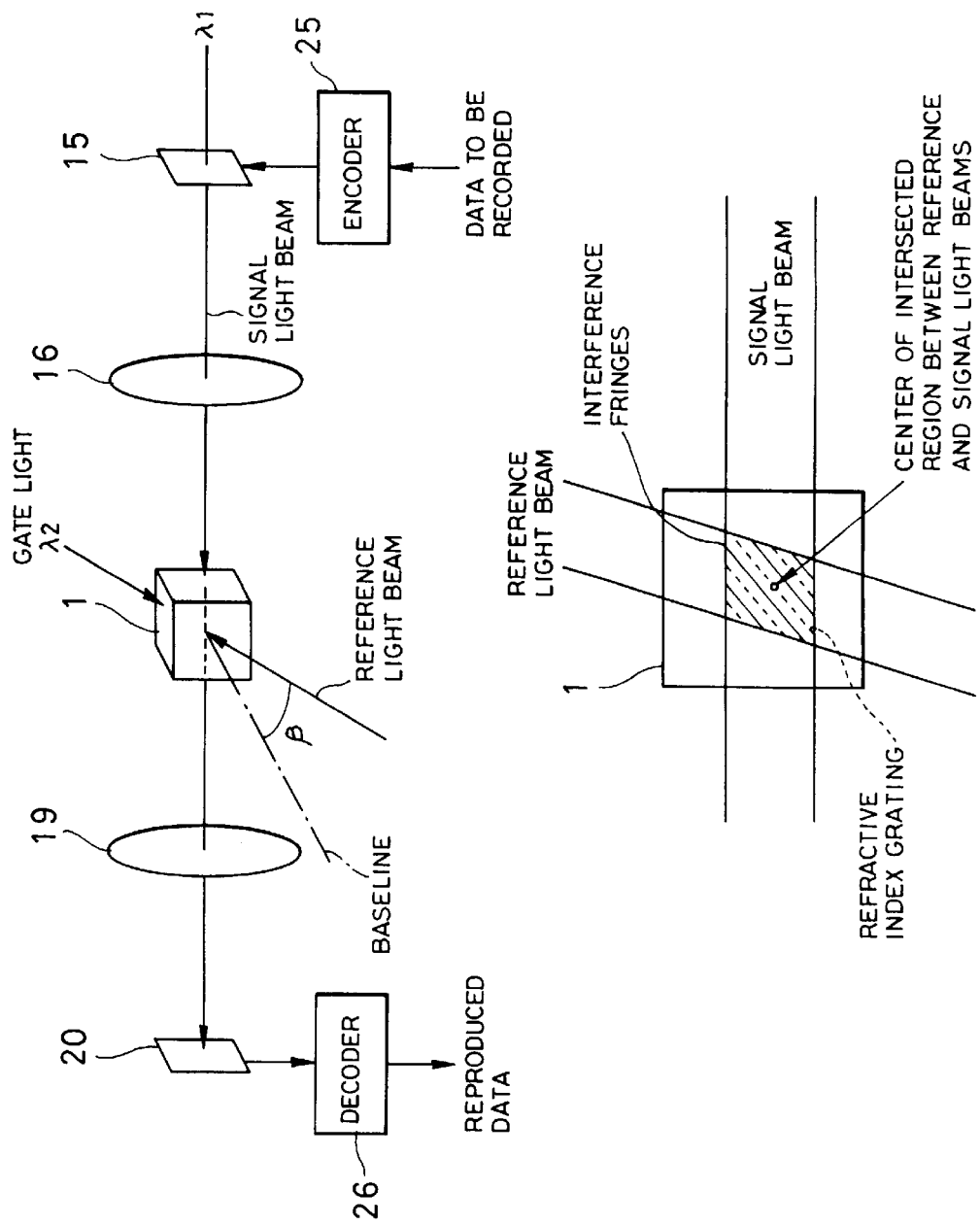
FIG. 1 is a schematic diagram illustrating a conventional hologram recording system.
Figure 2:
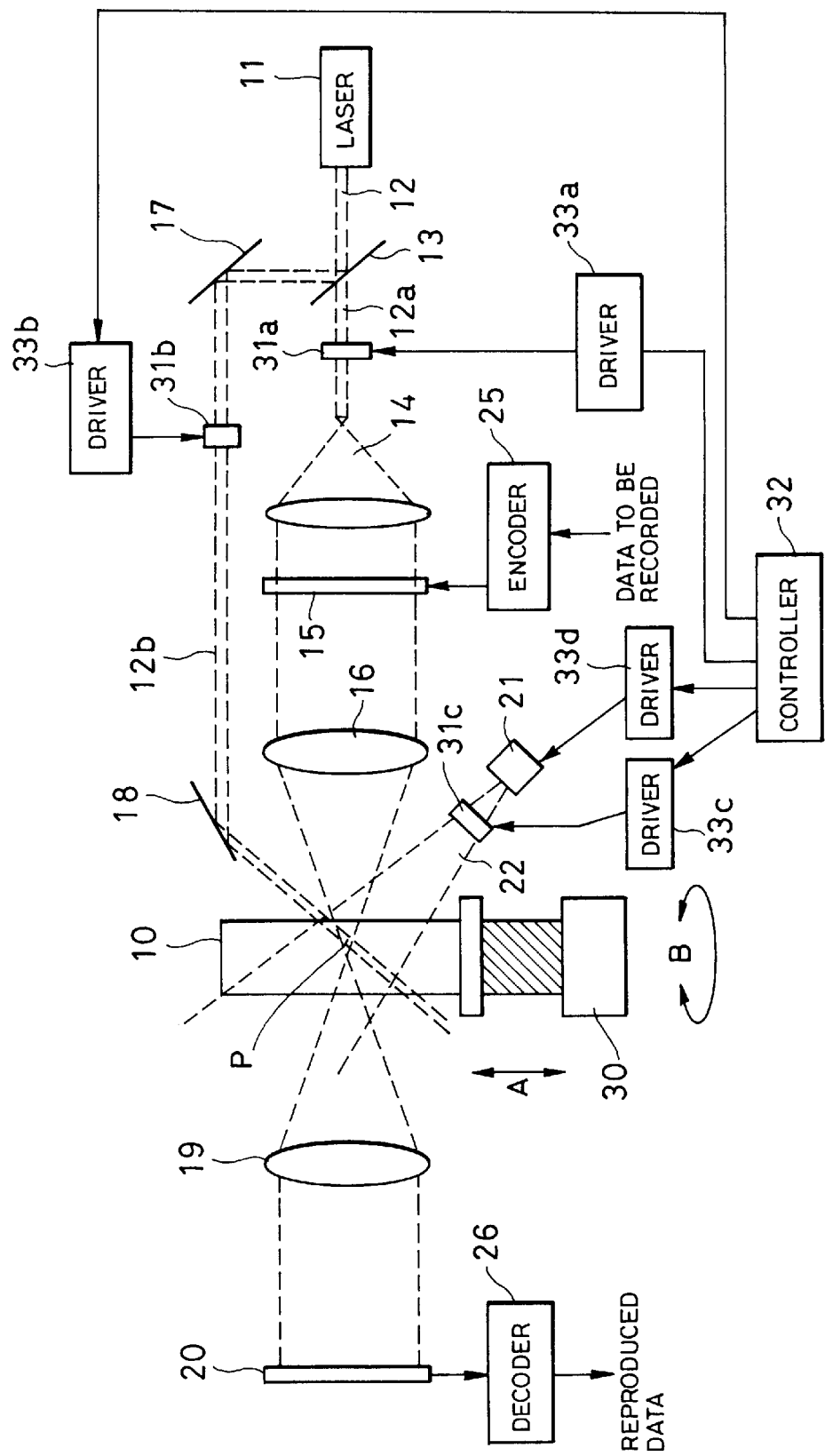
FIG. 2 is a block diagram illustrating a hologram recording/reproducing apparatus according to the present invention.

As illustrated in FIG. 2, a two-color hologram recording/reproducing apparatus according to the embodiment comprises a recording medium 10 which is formed of a photo-refractive crystal as a hologram recording medium that is sensitive to a first light at a first wavelength, i.e., in an ultraviolet ray band or in a short-wavelength visible light band to develop light induced absorption. This photo-refractive crystal may be lithium niobate ($LiNbO_3$) single crystal which is doped with a rare earth element such as Tb, and has a molar fraction of $[Li_2O]/([Li_2O]+[Nb_2O_5])$ in a range of 0.482 to 0.505 preferably from 0.490 to 0.505 or from 0.495 to 0.500, or lithium tantalate ($LiTaO_3$) single crystal which is doped with a rare earth element such as Tb, and has a molar fraction of $[Li_2O]/([Li_2O]+[Ta_2O_5])$ in a range of 0.482 to 0.505 preferably from 0.490 to 0.505 or from 0.495 to 0.500. Preferably, the amount of added Tb is in a range of 10 weight ppm to 1000 weight ppm. Also, this photo-refractive material may be simultaneously doped with Fe or Mn in addition to Tb, and the amount of such an additional dopant is preferably in a range of 1 weight ppm to 500 weight ppm.

The general configuration of the apparatus according to the embodiment is based on a conventional hologram recording apparatus using signal light and reference light, and additionally comprises an ultraviolet ray irradiation unit for irradiating ultraviolet rays or visible light in a short-wavelength range; and a gate light irradiation unit for directing gate light at a third wavelength into a hologram recording medium for developing a recording sensitivity of the hologram recording medium to activate or inactivate a refractive index grating in accordance with the presence or absence of a light interference pattern formed by signal light and reference light. The ultraviolet ray pre-irradiation unit may be incorporated in a body as illustrated in FIG. 2 such that a single light source is switched for gate light and ultraviolet rays through a light shutter, a filter or the like. Alternatively, a gate light source and an ultraviolet ray source may be provided as separate units.

A hologram recording method employed in the embodiment includes an ultraviolet irradiating process, i.e., a so-called pre-irradiation which corresponds to an initialization process for a recording medium 10 which is performed before the recording medium 10 is irradiated with signal light and reference light.

Therefore, once the recording medium 10 is initialized, i.e., irradiated with ultraviolet rays for a predetermined time in the pre-irradiation, the recording/reproduction follows a procedure conforming to the conventional hologram recording/reproducing apparatus. The present invention reduces the reproduction deterioration in the multiplex recordings. Therefore, the invention provides a relaxed design for a scheduling of a recording time in the multiplex recordings, unlike the conventional recording scheme.

Figure 3:
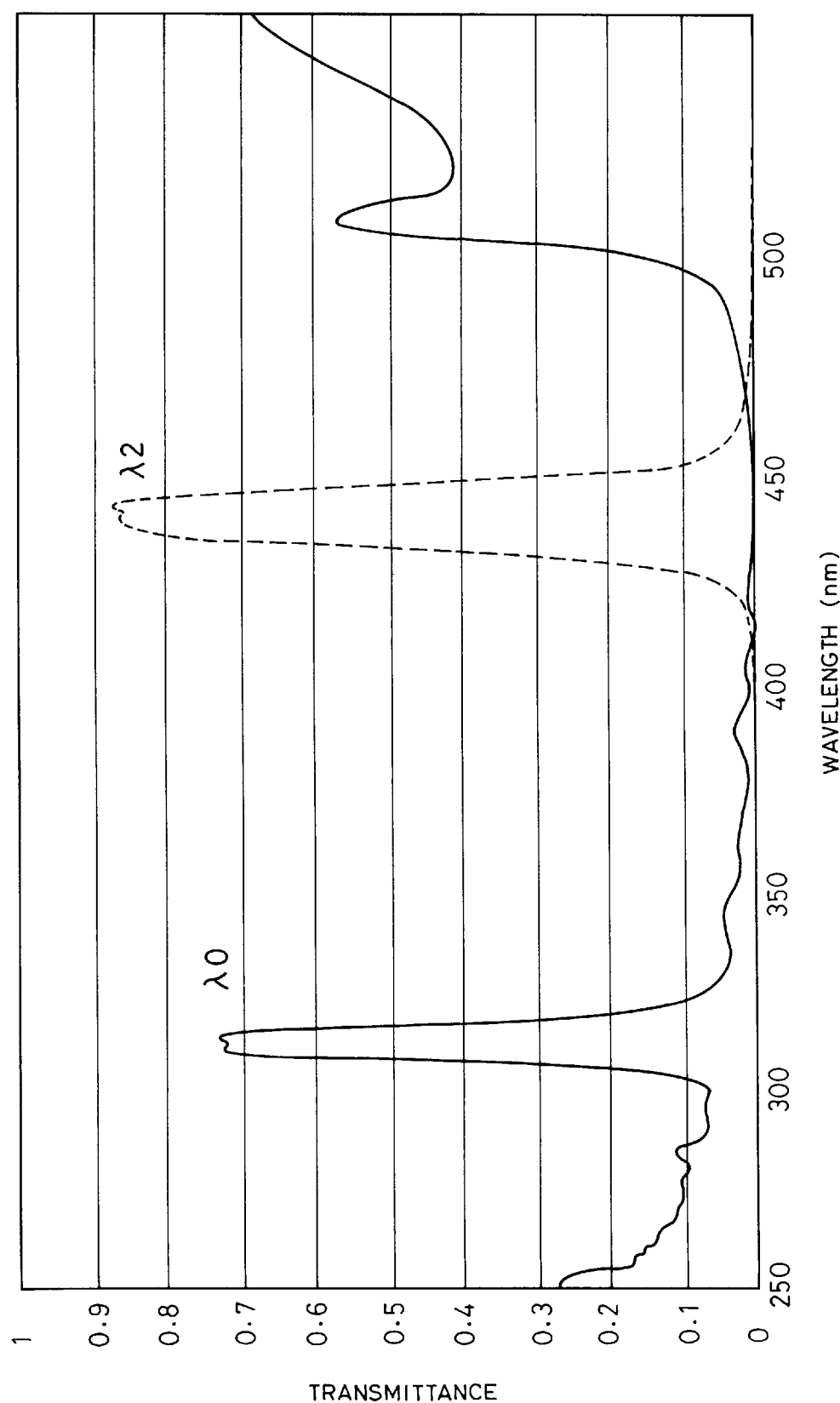
FIG. 3 is a graph showing the transmittance of a filter used for pre-irradiation of ultraviolet rays to a hologram recording medium in a two-color hologram recording/reproducing apparatus of an embodiment according to the present invention.

As illustrated in FIG. 2, a light source 21 having a pre-irradiation/gate light irradiation filter is used as an ultraviolet ray laser source at a first wavelength in an ultraviolet ray band or a short-wavelength visible light band, for example, at 313 nm. The light source 21 is a light source which has sufficient power to develop light induced absorption, i. e., coloring of the recording medium 10 by its irradiating light. The light source 21 having the pre-irradiation/gate light irradiation filter may be implemented, for example, by Model No. L5662-01 manufactured by Hamamatsu Photonix Co., which is switched to act as a bandpass filter with $\lambda 0=313$ nm to radiate light at a first wavelength of 313 nm for the pre-irradiation performed in accordance with the characteristic shown in FIG. 3, and switched to act as a bandpass filter with $\lambda 2=436$ nm to radiate gate light at a third wavelength of 436 nm for radiating gate light.

Light 22 emitted from the light source 21 having the pre-irradiation/gate light irradiation filter is pre-irradiation light at the first wavelength which is irradiated through a shutter 31c to the entire recording medium 10 or at least a hologram recording portion. The shutter 31c is provided for opening and closing the optical path of the pre-irradiation light 22. The shutter 31c is driven to open and close through a driver 33c in response to a signal sent by a controller 32.

A light source 11 for emitting light at a second wavelength longer than the first wavelength of 313 nm for producing signal light and reference light may be implemented by a near infrared laser (Model No. SDL-TC40 manufactured by SDL Co.) (having an oscillating wavelength at 850.0 nm). Recording laser light 12 emitted from the laser light source 11 is split into signal light 12a and reference light 12b by a beam splitter 13. The signal light 12a and the reference light 12b trace different optical paths and irradiated to the same position P in the recording medium 10. During recording of the hologram, the light 22 emitted from the light source 21 having the pre-irradiation/gate light irradiation filter serves as gate light at the third wavelength of 436 nm which is irradiated through the shutter 31c to the entire recording medium 10 or at least the hologram recording portion simultaneously with the irradiation by the laser light source 11.

On the optical path of the signal light 12a, the shutter 31a, a beam expander 14, an LCD 15, and a 4-f based Fourier transform lens 16 are disposed in this order. The shutter 31a is provided for opening and closing the optical path of the signal light 12a. The shutter 31a is driven to open and close by the driver 33a in response to a signal set by the controller 33. The beam expander 14 expands the beam diameter of the signal light 12a after passing through the shutter 31a, and irradiates the LCD 15 with the signal light 12a as a collimated light beam. The LCD 15 functioning as a spatial light modulator receives from an encoder 25 electrical data of unit page sequence corresponding to a two-dimensional plane page to display a light/dark dot matrix signal. The signal light 12a is optically modulated as it passes through the LCD 15, and includes the data as dot matrix components. The signal light 12a further passes through the 4-f based Fourier transform lens 16 which Fourier transforms the dot matrix components, and is converged to focus slightly before (near the laser light source 11) or slight after the position P in the recording medium 10.

The reference light 12b split from the signal light 12a by the beam splitter 13 is transmitted to the position P in the recording medium 10 by mirrors 17 and 18. A shutter 31b is disposed between the mirrors 17 and 18 so that the optical path of the reference light 12b can be opened and closed. The shutter 31b is driven to open and close by a driver 33b in response to a signal sent from the controller 32.

Further, an inverse Fourier transform lens 19 and a CCD functioning as a photoreceiver are disposed on the opposite side of the recording medium 10 to that on which the light from the laser light source 11 is incident, centered at the axis of rotation of the cylindrical recording medium 10. The inverse Fourier transform lens 19 is disposed at a position such that the signal light 12a, which focuses near the position P within the recording medium 10, crosses over and reaches the inverse Fourier lens 19, can be delivered to the CCD 20 as a collimated light beam. The CCD 20 is connected to a decoder 26. It should be noted that a tag corresponding to the type of a particular photo-refractive crystal may be previously attached to the recording medium 10, such that the tag is automatically read by a suitable sensor as the recording medium 10 is mounted on a movable stage 30 to allow the controller 32 to control vertical movements and rotation of the recording medium 10.

With the apparatus configured as described above, a light interference pattern is formed by the reference light and the signal light in a region within the recording medium 10 which is irradiated with the gate light, and information is recorded therein as a change in refractive index.

For reproducing information, on the other hand, the shutter 31a, 31c block the signal light 12a as well as the short wavelength light and the gate light 22 from the light source 21 having the pre-irradiation/gate light irradiation filter, to irradiate the recording medium 10 only with the reference light 12b. The light diffracted from the recording medium 10, which reproduces the recorded Fourier-transformed signal pattern, appears on the opposite side of the recording medium 10 to that irradiated with the reference light 12b. This Fourier-transformed signal pattern light is transmitted to an inverse Fourier lens 19 to inverse Fourier transform the Fourier-transformed light pattern to produce a dot pattern signal. The dot pattern signal is received by the CCD 20, functioning as a photoreceiver, which again converts the dot pattern signal to an electrical digital data signal which is then sent to a decoder for reproducing the original data.

The present invention is characterized by the employment of a recording material exhibiting the light induced absorption (photochromism) as well as the pre-irradiation of ultraviolet rays or visible light at a short wavelength and irradiation of the gate light. $LiNbO_3$ (or $LiTaO_3$) single crystals doped with a rare earth element such as Tb (terbium) or the like and having a stoichiometric composition exhibit very large light induced absorption when it is irradiated with ultraviolet rays at a wavelength near 313 nm. This is because carriers are excited from the light absorption center (donor level) near the valence band and trapped at the trap center (intermediate level). The depth of the intermediate level is calculated to be approximately 1.9 eV below the lower end of the valence band. The trapped carriers have reversibility so that they can be again excited by light at a wavelength shorter than 650 nm to return to the original donor level. Taking advantage of this property, laser light at a wavelength of approximately 850 nm may be used to record a hologram on a recording medium which has been irradiated with ultraviolet rays at a wavelength near 313 nm for coloring and filled with carriers at the intermediate level.

As the recording material is irradiated with a spatial light/dark pattern corresponding to interference fringes formed by reference light and signal light at a wavelength of 850 nm, the carriers at the intermediate level are excited in an irradiated portion of the recording material. The excited carriers are trapped again at a level near the valence band in a dark region, and finally, a spatial density distribution of the carriers is formed in correspondence to the interference fringes to produce a spatial electric field. In this way, an interference fringe pattern (hologram) is completely recorded within the crystals having a photorefractive effect as variations in refractive index.

The present invention differs substantially from the prior art in the following characteristics:

(1) the recording medium is implemented by stoichiometric composition lithium niobate or stoichiometric composition lithium tantalate previously colored by ultraviolet rays (ultraviolet light) irradiated thereto; and (2) once recording is completed, the recorded data is not destroyed even if they are read with a writing light (for example, at 850 nm).

With these characteristic, the hologram recording material and the recording scheme according to the present invention, when utilized, enables hologram recording without destructive reading even in a single color scheme.

(Embodiment)

Using a single crystal pulling equipment of a continuous source feeding type based on the double crucible method, a plurality of single crystals with the stoichiometric composition ratio (Tb-doped SLN) were grown which had an excellent optical homogeneous property. The Tb-doped single crystals with a molar fraction of $[Li_2O]/([Ta_2O_5]+[Li_2O])$ ranging from 0.482 to 0.505 were grown from a melted solution acquired by doping 100 weight ppm of Tb in the composition of a melted solution $[Li_2O]/([Ta_2O_5]+[Li_2O])$ ranging from 0.56 to 0.60.

When the respective as-grown crystals were irradiated with light of a wavelength of 313 nm and measured in the light absorption spectrum, such single crystals with a molar fraction of $[Li_2O]/([Ta_2O_5]+[Li_2O])$ ranging from 0.482 to 0.505 showed photochromism. Particularly the resultant as-grown crystals with a molar fraction of $[Li_2O]/([Ta_2O_5]+[Li_2O])$ ranging from 0.490 to 0.505 or from 0.495 to 0.500 showed significant photochromism. The trap center (intermediate level) was calculated to be approximately 1.9 eV below the valence band.

Figure 4:
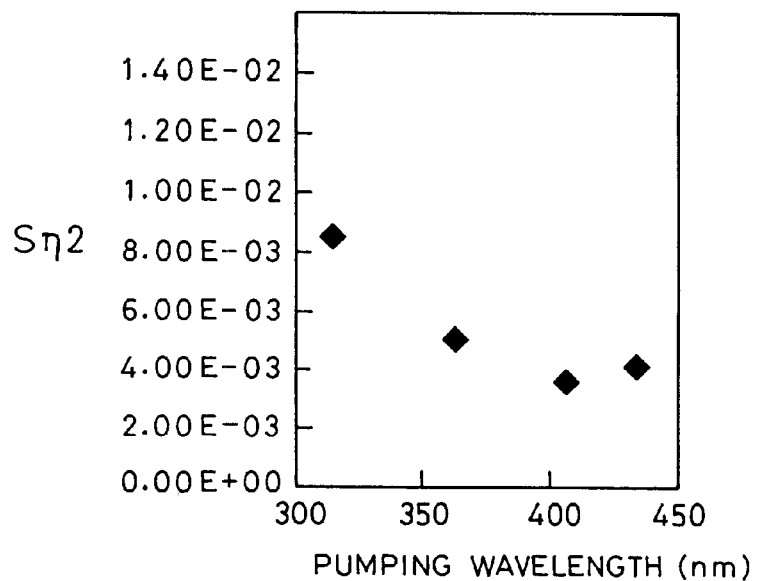
FIG. 4 is a graph showing a change in the photorefractive sensitivity $S_{n2}$ of a hologram recording medium versus the wavelength of gate light (pumping wavelength) after the medium has been pre-irradiated with ultraviolet rays in the two-color hologram recording/reproducing apparatus of the embodiment according to the present invention.
Figure 5:
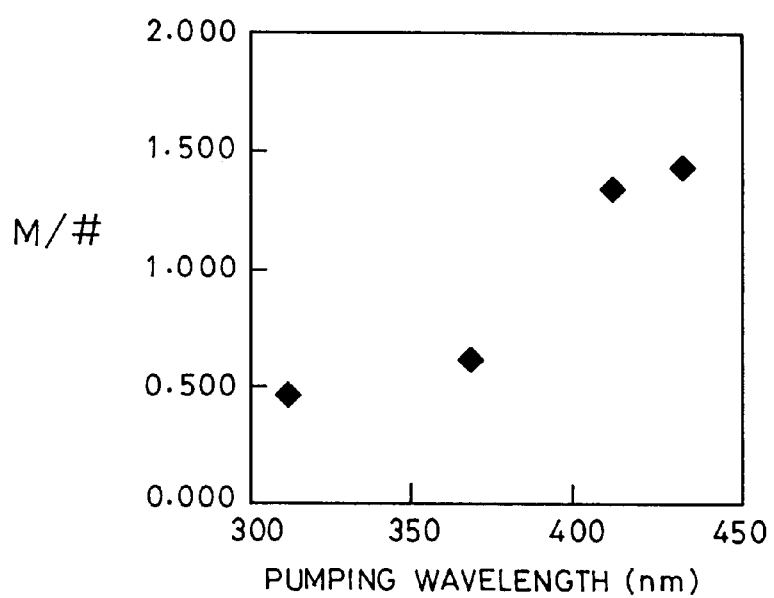
FIG. 5 is a graph showing a change in M number M/# of the hologram recording medium versus the wavelength of gate light (pumping wavelength) after the medium has been pre-irradiated with ultraviolet rays in the two-color hologram recording/reproducing apparatus of the embodiment according to the present invention.

The Tb-doped SLN crystal colored by irradiating the same with ultraviolet rays at a wavelength near 313 nm was irradiated with gate light at the third wavelength of 436 nm, while a laser at 850 nm was used to write a hologram thereinto. When the photorefractive sensitivity $S_{72\ 2}$ and the M number M/# of the medium were measured as the wavelength of the gate light (exciting wavelength) was varied, a high sensitivity and M number were obtained as shown in FIGS. 4 and 5. The photorefractive sensitivity $S_{\zeta 2}$ is defined as the slope of square root of the diffraction efficiency η as a function of time t at the very initial stage of hologram formation, divided by the product of the light power density and crystal thickness as follows:

$$S_{\eta 2} = \left(\frac{d\sqrt{\eta}}{dt}\right)_{t=0} / (IL)$$

where, I is light power density and L is the crystal thickness. The M number M/# is a system martial figure of merit for dynamic range at photorefractive multiplexed recording, which is defined as the coefficient of proportionality between the square root of the diffraction efficiency n and the number of holograms as follows:

$$\eta_M = \left(\frac{M/\#}{M}\right)^2$$

where, M is the multiplexed page number and $\eta_M$ represents the diffraction efficiency when the $M_{th}$ page is written.

Figure 6:
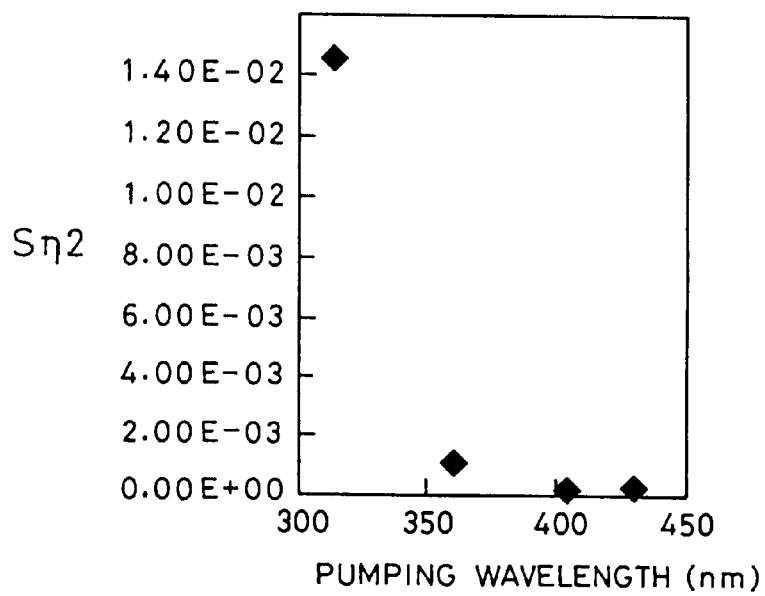
FIG. 6 is a graph showing a change in photorefractive sensitivity $S_{n2}$ of the hologram recording medium versus the wavelength of gate light (pumping wavelength) when the medium is not pre-irradiated with ultraviolet rays in the two-color hologram recording/reproducing apparatus of the embodiment according to the present invention.
Figure 7:
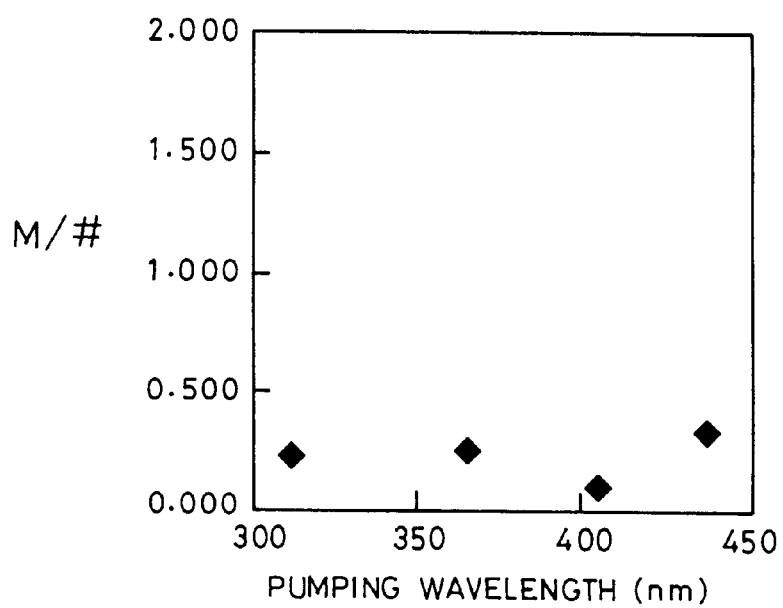
FIG. 7 is a graph showing a change in M number M/# of the hologram recording medium versus the wavelength of gate light (pumping wavelength) when the medium is not pre-irradiated with ultraviolet rays in the two-color hologram recording/reproducing apparatus of the embodiment according to the present invention.

As a comparative example, FIGS. 6 and 7 show data on the photorefractive sensitivity $S_{n2}$ and the M number M/# obtained from an experiment in which the crystals were not irradiated with ultraviolet rays. In comparison of the results in FIGS. 4 and 5 with those in FIGS. 6 and 7, it can be seen that the present invention improves the performance.

Figure 8:
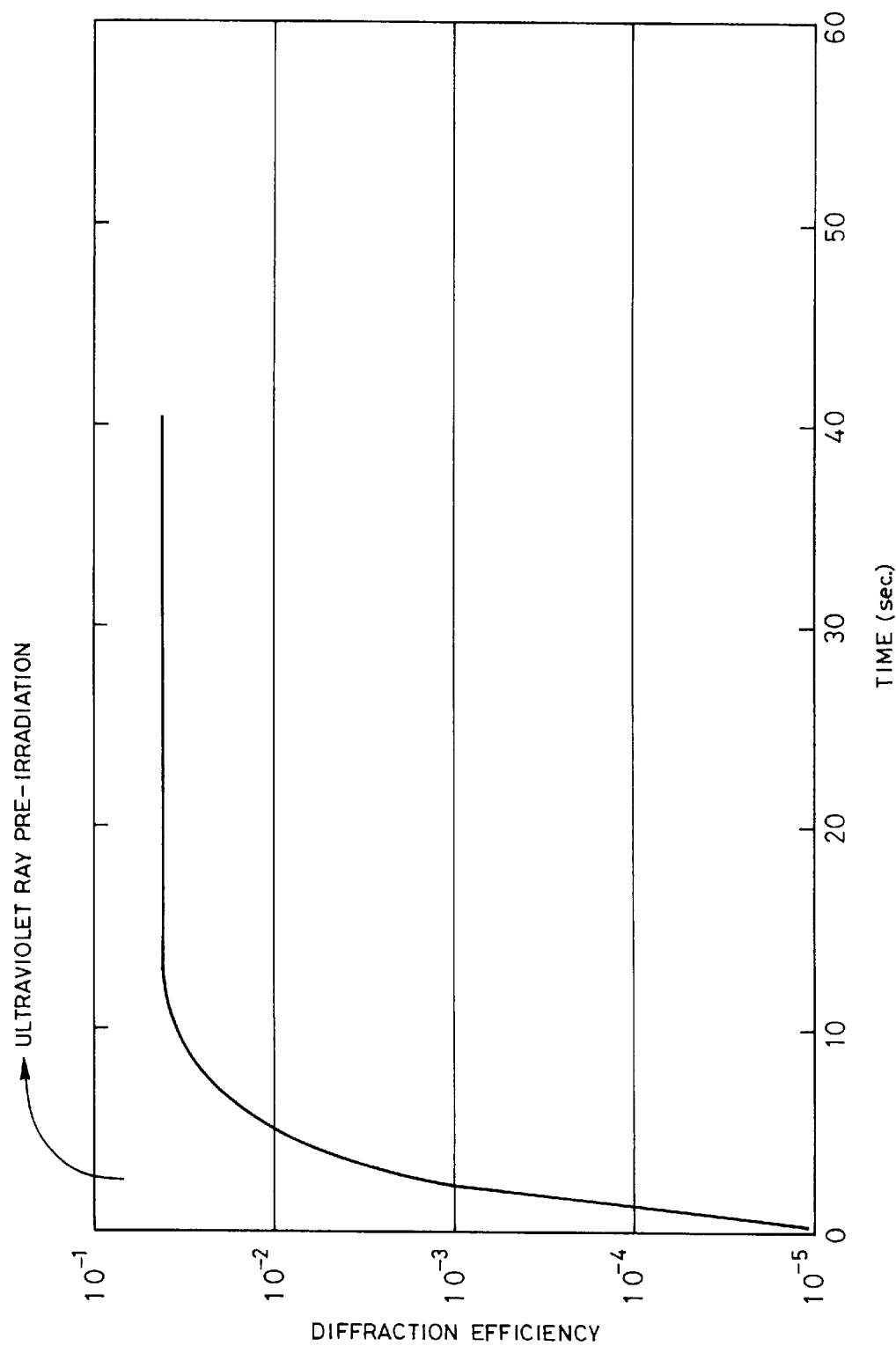
FIG. 8 is a graph showing a change in the diffraction efficiency over time after the hologram recording medium has been pre-irradiated with ultraviolet rays in a two-color hologram recording/reproducing apparatus of another embodiment according to the present invention.
Figure 9:
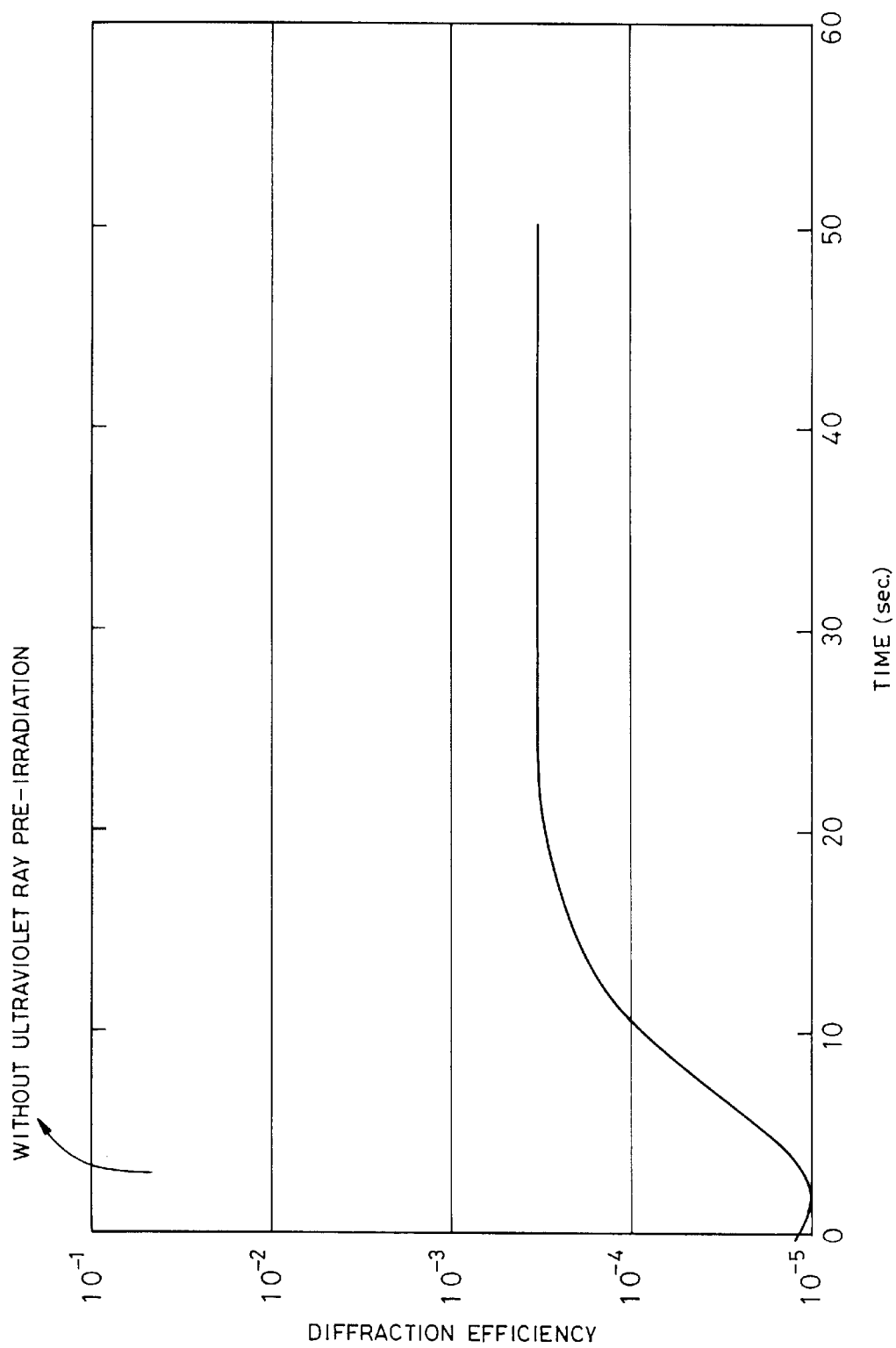
FIG. 9 is a graph showing a change in the diffraction efficiency over time when the hologram recording medium is not pre-irradiated with ultraviolet rays in a two-color hologram recording/reproducing apparatus of a comparative example.

Further, an investigation was made as to the influence of the presence or absence of the ultraviolet ray pre-irradiation at wavelength of 313 nm. For the investigation, the aforementioned apparatus was used under the following conditions: the power of ultraviolet rays at wavelength of 313 nm was 0.13 W/cm$^2$; the power of gate light at wavelength of 436 nm was 0.074 W/cm$^2$; and the power P of recording light at wavelength of 850 nm was 9 W/cm$^2$. The results of the investigation conducted with and without the ultraviolet ray pre-irradiation are shown in FIGS. 8 and 9. It is understood from these graphs that the ultraviolet ray pre-irradiation suppresses delayed writing and improves the diffraction efficiency.

The same investigation was made to stoichiometric single crystals doped simultaneously with Fe by 100 weight ppm, in addition to Tb by 200 weight ppm (Fe, Tb-doped SLN), with a molar fraction ranging from 0.495 to 0.50. Also, in this case, the diffraction efficiency was increased, and the reading indistructivity was improved. With the latter case, similar effects were produced when Mn was doped in place of Fe, and particularly, single crystals doped with such additives by an amount ranging from one weight ppm to 500 weight ppm exhibited favorable results.

In addition to the embodiments of Tb-doped lithium niobate (LiNbO$_3$) as the foregoing description, single crystals of Tb-doped lithium tantalate (LiTaO$_3$) showed similar effects to the Tb-doped lithium niobate. It is also preferable that the single crystal of lithium tantalate (LiTaO$_3$) should have the molar fraction of $[Li_2O]/([Li_2O]+[Ta_2O_5])$ that lies in a range of 0.482 to 0.505 preferably 0.490 to 0.505 or 0.495 to 0.500.

What is claimed is:

1. A two-color hologram recording/reproducing apparatus for directing interferable signal light and reference light into a hologram recording medium to record an information signal carried by the signal light, said hologram recording medium being sensitive to a first light at a first wavelength in an ultraviolet or short-wavelength visible light band to develop light induced absorption, said apparatus comprising:

means for irradiating said hologram recording medium with said first light;

means for irradiating said hologram recording medium with signal light and reference light at a second wavelength longer than said first wavelength after said first light is irradiated; and gate light means for directing gate light at a third wavelength into said hologram recording medium, said gate light causing said hologram recording medium to develop a recording sensitivity to activate or inactivate a refractive index grating in accordance with existence or non-existence of a light interference pattern formed by said signal light and said reference light.

2. A two-color hologram recording/reproducing apparatus according to claim 1, wherein said hologram recording medium comprises a photo-refractive material selected from a group consisting of a lithium niobate (LiNbO$_3$) single crystal which includes a rare earth element, and has a molar fraction of $[Li_2O]/([Li_2O]+[Nb_2O_5])$ in a range of 0.482 to 0.505, or lithium tantalate (LiTaO$_3$) single crystal which includes a rare earth element, and has a molar fraction of $[Li_2O]/([Li_2O]+[Ta_2O_5])$ in a range of 0.482 to 0.505.

3. A hologram recording apparatus according to claim 2, wherein the molar fraction of $[Li_2O]/([Li_2O]+[Nb_2O_5])$ of lithium niobate lies in a range of 0.490 to 0.505 or the molar fraction of $[Li_2O]/([Li_2O]+[Ta_2O_5])$ of lithium tantalate lies in a range of 0.490 to 0.505.

4. A two-color hologram recording/reproducing apparatus according to claim 2, wherein said rare earth element is Tb, and is doped by an amount ranging from 10 weight ppm to 1,000 weight ppm.

5. A two-color hologram recording/reproducing apparatus according to claim 4, wherein said photo-refractive material simultaneously includes Fe or Mn in addition to Tb.

6. A two-color hologram recording/reproducing apparatus according to claim 5, wherein said photo-refractive material includes Fe or Mn by an amount ranging from 1 weight ppm to 500 weight ppm.

7. A two-color hologram recording/reproducing apparatus according to claim 1, wherein said means for irradiating said hologram recording medium with signal light and reference light includes reference light means for directing a reference light beam into said hologram recording medium, and signal light means for directing a signal light beam modulated in accordance with image data into said hologram recording medium such that said signal light beam intersects with said reference light beam within said hologram recording medium to produce a three-dimensional light interference pattern with said reference light.

8. A two-color hologram recording/reproducing apparatus according to claim 1, further comprising means for detecting diffraction light from the refractive index grating of the light interference pattern of said hologram recording medium produced by said reference light beam irradiated thereto.

* * * * *

UNITED STATES PATENT AND TRADEMARK OFFICE
CERTIFICATE OF CORRECTION

PATENT NO.   : 6,373,806 B1  Page 1 of 1
DATED        : April 16, 2002
INVENTOR(S)  : Kitamura et al.

It is certified that error appears in the above-identified patent and that said Letters Patent is hereby corrected as shown below:

<u>Column 10,</u>
Line 14, "or lithium" should read -- or a lithium --.

Signed and Sealed this

Twenty-seventh Day of August, 2002

Attest:

JAMES E. ROGAN
Attesting Officer  Director of the United States Patent and Trademark Office